United States Patent [19]

Trueblood

[11] 4,326,214
[45] Apr. 20, 1982

[54] THERMAL SHOCK RESISTANT PACKAGE HAVING AN ULTRAVIOLET LIGHT TRANSMITTING WINDOW FOR A SEMICONDUCTOR CHIP

[75] Inventor: Richard K. Trueblood, San Jose, Calif.

[73] Assignee: National Semiconductor Corporation, Santa Clara, Calif.

[21] Appl. No.: 899,540

[22] Filed: Apr. 24, 1978

Related U.S. Application Data

[63] Continuation-in-part of Ser. No. 737,520, Nov. 1, 1976, abandoned.

[51] Int. Cl.³ .................. H01L 23/02; H01L 23/12; H01L 39/02
[52] U.S. Cl. ........................... 357/74; 357/30; 357/80; 29/588; 174/52 S
[58] Field of Search ............... 357/30, 74, 80; 174/528; 29/588

[56] References Cited

U.S. PATENT DOCUMENTS

| | | | |
|---|---|---|---|
| 2,647,070 | 7/1953 | Litton | 357/74 |
| 3,217,379 | 11/1965 | Mesecke | 357/30 |
| 3,220,095 | 11/1965 | Smith | 357/74 |
| 3,469,148 | 9/1969 | Lund | 357/74 |
| 3,495,023 | 2/1970 | Hessinger et al. | 29/588 |
| 3,622,419 | 11/1971 | London | 357/74 |
| 3,665,592 | 5/1972 | Apospors | 357/80 |
| 3,697,666 | 10/1972 | Wakley et al. | 174/52 S |
| 3,706,010 | 12/1972 | Laermer | 357/80 |
| 3,848,077 | 11/1974 | Whitman | 357/74 |
| 4,008,945 | 2/1977 | Scherer | 357/74 |
| 4,079,511 | 3/1978 | Grabbe | 357/74 |
| 4,105,861 | 8/1978 | Hascoe | 357/74 |

OTHER PUBLICATIONS

Mos Eprom Intel's Black Ceramic Package by Ken Kwong, Oct. 1976.

Primary Examiner—James J. Andrew
Attorney, Agent, or Firm—Brown & Martin

[57] ABSTRACT

A hermetically sealed thermal shock resistant ultraviolet light responsive read only semiconductor chip package includes a pair of mating ceramic members one of which mounts an ultraviolet sensitive semiconductor chip and the other which provides a window having an ultraviolet light transmitting glass sealingly mounted therein. The ultraviolet responsive chip is hermetically packaged by selecting a ceramic base member and a mating ceramic cap member, mounting an ultraviolet sensitive chip on the base and forming an ultraviolet transmitting window in the cap member and thereafter mating and sealing the members together so that the window covers the chip for permitting the transmission of ultraviolet rays thereto.

11 Claims, 8 Drawing Figures

PREPARE CERAMIC BASE MEMBER & MOUNT CHIP.

PREPARE CERAMIC CAP MEMBER & INSERT WINDOW.

FUSE WINDOW IN PLACE.

APPLY GLASS SOLDER.

SEAL MEMBERS TOGETHER.

THERMAL SHOCK RESISTANT PACKAGE HAVING AN ULTRAVIOLET LIGHT TRANSMITTING WINDOW FOR A SEMICONDUCTOR CHIP

REFERENCE TO RELATED APPLICATION

This application is a Continuation-In-Part of my copending application Ser. No. 737,520, filed Nov. 1, 1976 and entitled "Ultraviolet Light Transmitting Window for a Semiconductor Chip" and now abandoned.

BACKGROUND OF THE INVENTION

The present invention relates to hermetically sealed thermal shock resistant semiconductor devices and pertains particularly to hermetically sealed ultraviolet sensitive semiconductor chip and method of packaging the same.

Some semiconductor chips are responsive to light rays to either generate an output or change its response to a signal or input. For example, some programmable read only memory devices (PROMs) have been found to be eraseable by means of ultraviolet light. Such devices have gained wide acceptance in the industry because of the ease in programming thereof. These devices, however, must be hermetically sealed in order to ensure the reliability and functioning thereof and at the same time be packaged to be accessible by ultraviolet rays. Many approaches to the sealing of such devices have been proposed in the past.

The currently popular prior art approaches to the hermetically sealing of these read only memory devices are disclosed and discussed in the U.S. Pat. No. 3,924,246, issued Dec. 2, 1975 to Scherer, U.S. Pat. No. 3,217,379, issued Nov. 16, 1975 to Mesecke, and U.S. Pat. No. 3,281,606, issued Oct. 25, 1966 to Lueck. Another technique of packaging light responsive devices is shown in U.S. Pat. No. 3,482,198, issued Dec. 2, 1969 to Hopper, Jr., which is concerned with hermetic sealing but not thermal shock or ultraviolet transmission windows. Other packaging not concerned with hermetic sealing or shock resistance is shown in U.S. Pat. No. 2,773,925 to Rothlein et al. and U.S. Pat. No. 3,622,419 to London. These prior art approaches, however, still present numerous problems for which the present approach is devised to overcome.

One of such problems is that of obtaining a reasonable degree of thermal shock resistance, due to the bonding of a metallic mounting member to a ceramic packaging member. Such bonds when subjected to thermal shock are subjected to severe stresses as a result of the different expansion ratios between the window glass and the metallic members and between the ceramic and the metallic members. This is especially a problem where military specifications must be met. Other problems result from the high number of seals required for the metallic bond approach which result in more chances for leaks to develop within the system. This prior art approach was necessary because of the limitations of materials.

These prior art techniques are also more expensive in that they require special package structures and also require expensive metal fabrication and plating. The currently popular approach for example requires gold plating which is an expensive process.

These prior art approaches cannot take advantage of mass produced ceramic dual in line pin (CERDIP) packaging that is currently used for many semiconductor devices. The prior art approach was necessary because of the limitations of materials.

Accordingly, it is desirable that a new hermetically sealed thermal shock resistant package construction and method be devised for ultraviolet sensitive semiconductor devices.

SUMMARY AND OBJECTS OF THE INVENTION

It is the primary object of the present invention to overcome the above problems of the prior art.

Another object of the present invention is to provide an improved thermal shock resistant package construction for packaging an ultraviolet sensitive semiconductor device.

A still further object of the present invention is to provide an improved thermal shock resistant structure for hermetically packaging ultraviolet responsive programmable read only memory devices.

A still further object of the present invention is to provide an improved method of fabricating ultraviolet responsive programmable read only memory devices that are hermetically sealed and highly resistant to thermal shock.

In accordance with the primary aspect of the invention an ultraviolet responsive semiconductor chip is hermetically packaged within a thermal shock resistant package defined by a pair of mating ceramic members one of which mounts the semiconductor chip and the other of which mounts a hermetically sealed ultraviolet transmissive window providing ultraviolet access to the chip.

Another aspect of the invention involves a method of fabricating an ultraviolet sensitive programmable memory device including the steps of selecting mating ceramic members, mounting an ultraviolet programmable chip on one of said members, forming a hermetically sealed ultraviolet window in the other of said members, mating and securing said members together for forming a hermetically sealed package.

BRIEF DESCRIPTION OF THE DRAWING

The above and other objects of the present invention will become apparent from the following description when read in conjunction with the drawings wherein.

DETAILED DESCRIPTION OF A PREFERRED EMBODIMENT

Figure 1:
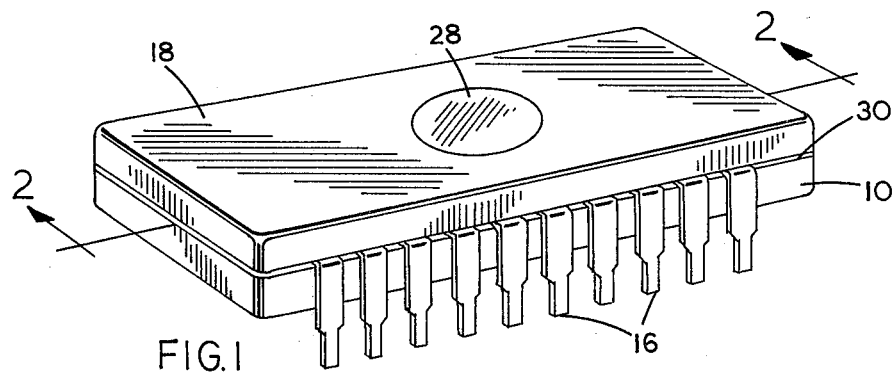
FIG. 1 is a perspective view of a preferred embodiment of the invention.
Figure 2:
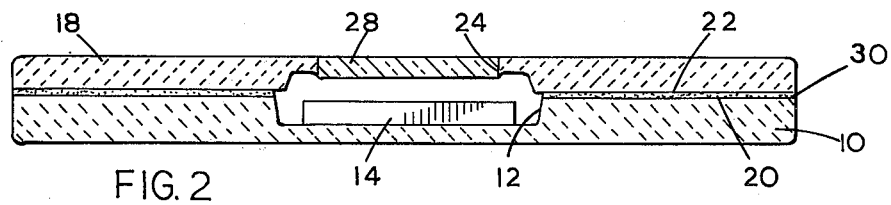
FIG. 2 is an enlarged sectional view taken generally on lines 2—2 of FIG. 1.

Turning now to the drawings, particularly FIGS. 1 and 2, a preferred embodiment of the package of the invention is illustrated and comprises a ceramic base member 10 having a cavity 12 formed therein in which is mounted a programmable read only memory device (PROM) 14. The programmable read only device 14 is connected by a plurality of leads 16 which extend to the edge of the base member 10 for connecting to other electronic components of a system. A ceramic cap member 18 has a mating surface 20 which cooperates with a mating surface 22 of the ceramic base member 10. An aperture 24 is formed through the ceramic cap member 18 in a position over or corresponding to the position of the chip 14.

An ultraviolet transmitting glass member 28 is sealingly mounted directly within the aperture 24 to form a hermetic seal. This glass member can be any suitable glass which will pass a high percentage of ultraviolet light or rays and has a suitable coefficient of thermal expansion. Such a coefficient of expansion would ideally match that of the ceramic cap and base members. However, glasses of such specification are not known at this time. Ultraviolet rays are in the frequency range of 2537 Angstroms, and the glass must pass at least 50% and preferably 60% or more of the ultraviolet rays. Suitable materials for the window consists of, for example, high purity alumino borosilicate glasses. A suitable glass is available from Corning Glass Works as No. 9741 Borosilicate glass. This glass is available with a coefficient of thermal expansion in the range of from 38 to $40 \times 10^{-7}$ in/in/°C. This falls approximately half way between the coefficients of quartz (an ultraviolet window material) having a coefficient of $5.5 \times 10^{-7}$ in/in/°C. and the usual ceramic material ($Al_2O_3$) having a coefficient of from 60 to $70 \times 10^{-7}$ in/in/°C.

As previously pointed out the usual cap member for hermetically sealing with a window is made of KOVAR which has a coefficient of $45 \times 10^{-7}$ in/in/°C. when closely matches the coefficient of thermal expansion of the borosilicate glass. Thus, one could expect a relatively good seal in view of the thermal expansion match. On the other hand, the mismatch between high purity borosilicate glass with a coefficient of 38 to $40 \times 10^{-7}$ in/in/°C. and the ceramic material of the cap member 60 to 70 in/in/°C. would lead one to expect cracking of either the glass or the ceramic when subjected to thermal shock. I have found, however, that a very good shock resistent seal can be obtained with borosilicate glass in an aluminia ($Al_2O_3$) cap.

The ceramic cap member 18 will have a higher coefficient of thermal expansion than that of the glass such that stresses will develop as a result of the differential. This can be used to advantage, and in accordance with one preferred method of mounting of the glass 28 a partial compression seal results between the glass member 28 and the ceramic cap member 18. In any event, the glass window is selected to have a coefficient of thermal expansion that is approximately 38 to $40 \times 10^{-7}$ in/in/°C. and as closely as possible matches that of the cap member. The window 28 may be of any suitable configuration as desired. Preferably the window will be of such dimension to permit the most efficient radiation of the chip 14 with ultraviolet rays.

The window or glass member 28 is bonded within the aperture 24 in a preferred method by raising the temperature thereof to the neighborhood of 1100° C. to thereby melt the glass causing it to soften and fuse to the ceramic cap member 18. This results in a bond that is both compressive and chemical in nature and forms a hermetic seal.

The ceramic members 10 and 18 are preferably of the same ceramic material for higher thermal shock resistance, although they need not be for lower resistance. A preferred ceramic material is alumina ($Al_2O_3$).

The two ceramic members 10 and 18 are secured together along the faces 20 and 22 by a suitable solder 30, such as for example, a solder glass. Such solder glasses are available in the following designations and companies such as KC-1 M, from Kyocera International, Inc.; SG-5 from the Technical Ceramics Division of NGK Spark Plug; TG 370 from Technology Glass Corporation; XS 1175 from Owens-Illinois, Inc.; and DC-5 from Plessey, Inc. The soldering temperature is typically around 425° to 475°. This temperature is sufficiently low as to avoid injury to any of the components of the assembly. The use of such solder glasses give a good bond and hermetic seal between the ceramic base and cap members.

Figure 3:
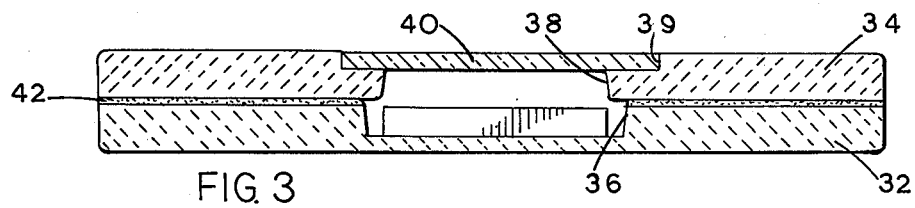
FIG. 3 is a similar sectional view showing an alternate embodiment of the invention.

Turning now to FIG. 3, an alternate construction of the invention is illustrated wherein the base and cap ceramic members 32 and 34 are selected having the appropriate mating surfaces and appropriate cavities 36 and aperture 38 respectively. An ultraviolet window 40 is secured or mounted in a stepped bore 39 of the aperture 38 by suitable bonding method. The window member 40 may be secured to the ceramic member 34 by fusion as in the previous embodiment or by use of an additional suitable bonding agent. Such bonding agents can of course be a suitable solder such as a glass solder, as described above, but having a higher bonding temperature.

The ceramic base and cap members 32 and 34 are secured or bonded together along their faces by a suitable layer of solder material 42 as in the previously described embodiment.

Figure 4:
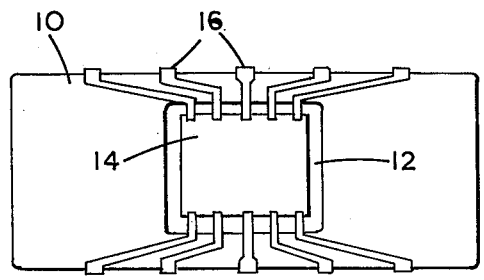
FIGS. 4 through 8 illustrate the method steps of the present invention.
Figure 5:
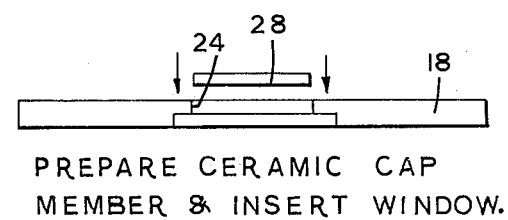
Figure 6:
Figure 7:
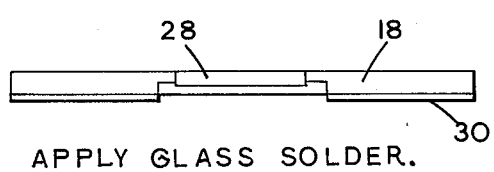
Figure 8:

In accordance with the method of the present invention, a programmable memory device which is sensitive to ultraviolet light is constructed by selecting base and cap ceramic members, forming mating surfaces thereon, mounting an ultraviolet sensitive programmable chip on the ceramic base member mounting an ultraviolet transmission window in ceramic cap member, and bonding the ceramic members together along the mating faces such that the window exposes the ultraviolet sensitive chip. The step of mounting the chip may be carried out by first forming a depression or cavity in the ceramic base member and mounting the chip within the cavity, as in FIG. 4. Suitable leads are formed from the chip to the outer edge to suitable terminals at the outer edges of the ceramic members. During the process of bonding the two ceramic members together, the leads are sandwiched between the two ceramic members as shown. The step of forming the ultraviolet window is carried out by forming an aperture in the second of said members and covering said aperture with an ultraviolet transmissive member. This may be carried out by forming a window member to substantially fit the aperture and heating the window member to approximately 1100° C. and thereby fuse the window member into the aperture, as in FIGS. 5 and 6. In an alternate approach, the window is formed by a sheet of ultraviolet transmissive glass that rests in a stepped bore of the aperture and includes the step of bonding the glass to the ceramic member either by fusion or by a suitable solder material. The two ceramic members are joined together along their mating faces by a suitable step such as soldering. The soldering step may be carried out by providing a glass solder along the surface or face of one of said members as in FIG. 7, and heating the solder material to its fusing temperature of approximately 425° to 475° while forcing the two ceramic members together along their faces, as in FIG. 8.

The present invention was devised to utilize standard CERDIP package components in order to avoid the currently popular high cost special construction packaging techniques of the prior art. Packages in accordance with the invention have been found to consistently exceed military specifications, which require maintenance of hermetic seal at a 100° C. differential for 15 cycles. This was completely unexpected in view of the expansion mismatch between ceramic materials and ultraviolet transmitting glasses. Due to the high expansion mismatch between glass and ceramics one could expect cracking of the device when subjected to thermal shock. The prior art approach has always been to use material known as KOVAR for the mounting of ultraviolet windows. This was an expensive process. The present packages have been found to maintain hermecity of $1 \times 10^{-8}$ ATM-CC/SEC Helium after application of the following: (a) thermal shock of a 215° C. differential between baths at $-65°$ C. and $+150°$ C. with movement from one liquid bath to another within 10-15 seconds and a dwell time of approximately 5 minutes in each bath.

While the present invention has been illustrated and described by means of specific embodiments, it is to be understood that numerous changes and modifications may be made therein without departing from the spirit and scope of the invention as defined in the appended claims. For example, photocells may be packaged in accordance with the invention where such durable hermetically sealed devices are desirable.

Having described my invention, I now claim:

1. A hermetically sealed thermal shock resistant ultraviolet responsive semiconductor device comprising:
    a ceramic base member,
    an ultraviolet responsive chip mounted on said ceramic base member,
    a ceramic cap constructed of the same material as said base member and having an aperture therethrough,
    an ultraviolet transmitting window consisting of a sheet of ultraviolet transmitting material having a coefficient of thermal expansion that is compatible with that of the cap sealingly mounted on and bonded directly to said ceramic cap member covering and hermetically sealing said aperture, and
    said ceramic base and cap members hermetically sealed together so that said window is disposed over said chip.

2. The ultraviolet responsive device of claim 1, wherein said ceramic material from which said cap member and said base member are made is $Al_2O_3$.

3. The ultraviolet responsive device of claim 1, wherein:
    said base member includes a cavity formed therein, and
    said ultraviolet responsive chip is a programmable read only memory chip mounted within said cavity in said ceramic base member.

4. The ultraviolet responsive device of claim 3, wherein said window comprises a high purity alumino borosilicate glass member fused to said cap member within said aperture.

5. The ultraviolet responsive device of claim 3, wherein:
    said cap member includes a stepped bore defining said aperture,
    said ultraviolet window consists of a sheet of high purity alumino borosilicate glass fused into said stepped bore of said ceramic cap member for covering said aperture.

6. The ultraviolet responsive device of claim 5, wherein said ceramic base and cap members are bonded together by a film of solder glass.

7. The ultraviolet responsive device of claim 3, wherein said base and said cap are generally rectangular in configuration.

8. The ultraviolet responsive device of claim 7, wherein said base member includes a lead frame having dual in-line pins.

9. The ultraviolet responsive device of claim 7, wherein said cap member has substantially the same outside dimensions as said base.

10. The ultraviolet responsive device of claim 4, wherein said glass member has a coefficient of thermal expansion of approximately $38 \times 10^{-7}$ in/in/°C.

11. The ultraviolet responsive device of claim 5, wherein said glass member has a coefficient of thermal expansion of at least $38 \times 10^{-7}$ in/in/°C.

* * * * *